United States Patent [19]

Nihonmatsu et al.

[11] Patent Number: 6,080,641

[45] Date of Patent: Jun. 27, 2000

[54] METHOD OF MANUFACTURING SEMICONDUCTOR WAFER

[75] Inventors: Takashi Nihonmatsu; Makoto Osuga, both of Nagano, Japan

[73] Assignee: Shin-Etsu Handotai Co., Ltd., Tokyo, Japan

[21] Appl. No.: 08/858,377

[22] Filed: May 19, 1997

[30] Foreign Application Priority Data

May 22, 1996 [JP] Japan .................................. 8-150369

[51] Int. Cl.⁷ ............................ H01L 21/30; H01L 21/46
[52] U.S. Cl. .................... 438/459; 438/458; 438/691; 438/692; 438/974
[58] Field of Search .................................. 438/974, 459, 438/458, 691, 692

[56] References Cited

FOREIGN PATENT DOCUMENTS

| | | |
|---|---|---|
| 0607940 | 7/1994 | European Pat. Off. . |
| 0764976 | 3/1997 | European Pat. Off. . |
| 2289982 | 12/1995 | United Kingdom . |

*Primary Examiner*—John F. Niebling
*Assistant Examiner*—David A. Zarneke
*Attorney, Agent, or Firm*—Oliff & Berridge, PLC

[57] ABSTRACT

There is disclosed a method of manufacturing semiconductor wafers, in which a lapping process is performed prior to a chamfering process. This makes it possible to manufacture semiconductor wafers while maintaining the smoothness and dimensional accuracy of a chamfered surface of each wafer obtained by the chamfering process.

8 Claims, 3 Drawing Sheets

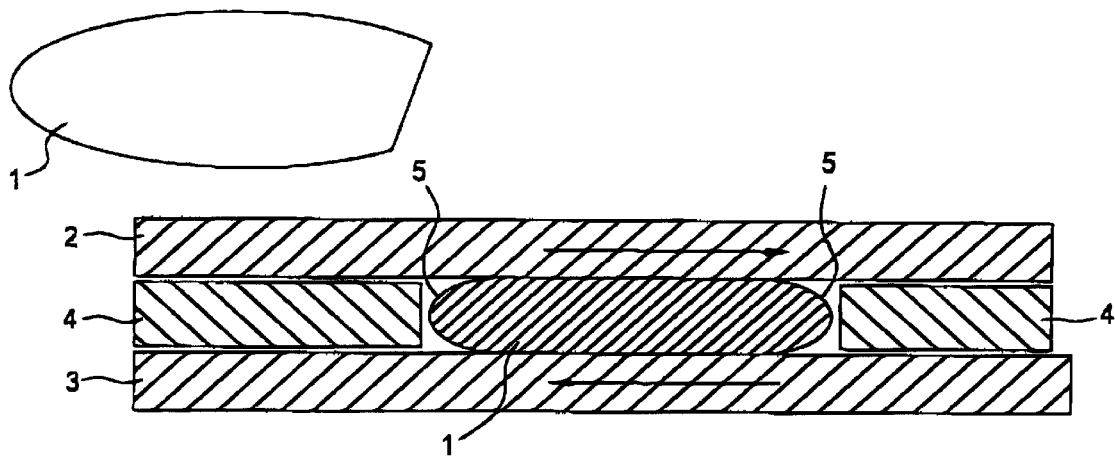
FIG. 1B
FIG. 1A
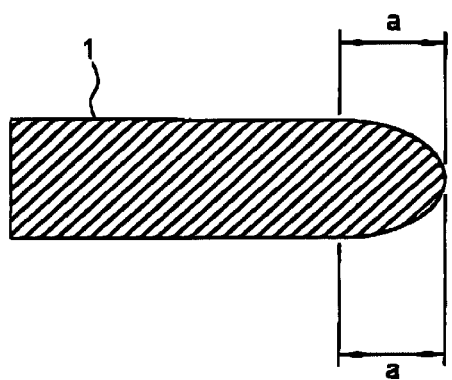
FIG. 2

METHOD OF MANUFACTURING SEMICONDUCTOR WAFER

BACKGROUND OF THE INVENTION

1. Field of the Invention

The present invention relates to a method of manufacturing a semiconductor wafer made of, for example, silicon, GaAs, GaP or InP.

2. Description of the Related Art

Semiconductor wafers have been produced by a process of slicing a monocrystalline ingot of silicon or the like to obtain wafers, chamfering the peripheral edge of each sliced wafer, then lapping, acid-etching, and mirror-polishing the same.

In this process, chamfering the peripheral edge of the sliced wafer is an essential step. A monocrystal of silicon or the like is very hard and brittle, and unless the peripheral edge of each sliced wafer is subjected to the chamfering process, the sliced wafer may be cracked or chipped during the process of manufacturing semiconductor wafers and devices, resulting in a decrease in the yield and degradation in the characteristics of the semiconductor devices.

Methods for chamfering are generally classified into a chemical method in which the peripheral edge of each wafer is chemically rounded and a mechanical method in which the peripheral edge of each wafer is mechanically chamfered through use of a grindstone. With the trend that the diameters of wafers have increased, the latter-mentioned mechanical method has been widely used because it can produce wafers having consistent quality and high dimensional accuracy.

In order to chamfer the peripheral edge of a wafer by the mechanical method, the wafer must be held firmly. Since the chamfering is applied to the peripheral edge of the wafer, the wafer is held at its main surface. Therefore, when the wafer is held, the main surface of the wafer is likely to become scratched and/or stained. However, since a pattern of a device is formed on the main surface of the wafer, the main surface of the wafer must be prevented from becoming scratched and stained. Because of this, wafers are generally processed in the following manner: First, the chamfering process is performed immediately after each wafer is sliced from a monocrystalline ingot; after the completion of the chamfering process, the wafer is subjected to the lapping process, in which the main surface of the wafer is ground and the thickness of the wafer is made uniform. Through this lapping process, scratches and stain generated on the main surface of the wafer during the chamfering process are removed.

With a recent increase in the degree of integration of semiconductor devices, it has been demanded that the chamfered surface of each wafer be improved in terms of smoothness and dimensional accuracy. Conventionally, the smoothness of the chamfered surface of a wafer is improved through employment of a grindstone including smaller diameter abrasive grains, while the productivity is sacrificed, and the dimensional accuracy of the chamfered surface of the wafer is improved through improvements on the accuracy of a chamfering machine and control technology therefor.

However, if the lapping process is performed subsequent to the chamfering process, the above-described quality improvements on the smoothness and dimensional accuracy of the chamfered surface diminish. That is, as illustrated in FIG. 1A and FIG. 1B, the lapping process is performed in a manner such that a chamfered wafer 1 is placed between an upper lapping turn table 2 and a lower lapping turn table 3, and a mixture (abrasive agent) comprising lapping fluid and abrasive grains is applied between the wafer 1 and the upper lapping turn table 2 and between the wafer 1 and the lower lapping turn table 3, then the main surfaces of the wafer 1 are rubbed between the upper lapping turn table 2 and the lower lapping turn table 3 while pressure is applied thereon. In this process, a holding member 4 is utilized to hold the wafer 1. The abrasive grains enter the space between the holding member 4 and the wafer 1, so that the peripheral edge portion 5 of the wafer 1 is also ground and the shape of the peripheral edge portion 5 of the wafer 1 is degraded. Further, the abrasive grains utilized for the lapping process are more coarse than those used for chamfering, so the chamfered surface of the wafer 1 becomes rougher, and as a result, the smoothness and dimensional accuracy of the chamfered surface of the wafer 1 cannot be maintained at the high level achieved during the chamfering process.

Therefore, there exists a demand for a method of manufacturing a semiconductor wafer which can maintain the smoothness and dimensional accuracy of a chamfered surface of a wafer achieved during the chamfering process.

SUMMARY OF THE INVENTION

In view of the foregoing, an object of the present invention is to provide a method of manufacturing a semiconductor wafer which can maintain the smoothness and dimensional accuracy of a chamfered surface of a wafer achieved through a chamfering process.

The inventors of the present invention found that the aforementioned drawback can be solved by carrying out a lapping process prior to a chamfering process instead of after the chamfering process. The present invention has been made based on this finding.

According to a first aspect of the present invention, there is provided a method of manufacturing a semiconductor wafer wherein a lapping process is performed prior to a chamfering process. According to a second aspect of the invention, there is provided a method of manufacturing a semiconductor wafer, comprising the steps of slicing a monocrystalline ingot to obtain a wafer; lapping the sliced wafer; chamfering the lapped wafer; etching the chamfered wafer with acid; and mirror-polishing the etched wafer.

Since the chamfering process is performed after the lapping process, a semiconductor wafer can be manufactured while the smoothness and dimensional accuracy of the chamfered surface achieved by the chamfering process are prevented from degrading. Further, since the lapped wafer has a uniform thickness, there is an additional advantage that the dimensional accuracy of the chamfered surface can easily be secured during the subsequent chamfering process. The width of the chamfered surface (hereinafter referred to as "the chamfered width") usually ranges from 400 to 500 μm. The chamfered width is represented by dimension "a" in FIG. 2, which shows a partial cross-sectional view of a wafer 1.

Preferably, a wafer is subjected to a preliminary chamfering process prior to the lapping process.

The reason for performing the preliminary chamfering process prior to the lapping process is that if the lapping process is performed on a wafer immediately after it is sliced from a monocrystalline ingot, the wafer becomes cracked during the lapping process as it has angular edges at its circumference, and as a result, the wafer is damaged by chips and cracks generated during the lapping process.

Further, the flatness of the main surface of the wafer upon completion of the lapping process remarkably degrades compared to the case where the lapping process is performed subsequent to the chamfering process. Because of this, the preliminary chamfering process is performed, so that the wafer is protected from chipping and cracking. Further, by following this process, the degree of flatness of the main surface of the wafer achieved by the lapping process is prevented from degrading.

As the preliminary chamfering process, there can be employed a chamfering process that is performed under lenient quality control compared to that applied to the conventional chamfering process. Therefore, a cheap chamfering machine of lower accuracy and performance can be utilized. Of course, a chamfering machine used for ordinary chamfering having better accuracy and performance can be utilized as well.

Preferably, the width of the chamfered surface formed during the preliminary chamfering process performed prior to the lapping process is determined such that the final chamfered width after completion of the lapping process becomes at least 100 $\mu$m, preferably between 100 $\mu$m and 300 $\mu$m inclusive. This is because the thickness of the wafer decreases as the lapping process is performed, and accordingly the chamfered width will decrease.

This is also because if the chamfered width formed by the preliminary chamfering process is such that the final chamfered width upon completion of the lapping process is less than 100 $\mu$m, the degradation in the flatness of the main surface of the wafer after completion of the lapping is still large. Also, the reason why it is preferred that the final chamfered width after completion of the lapping process be not greater than 300 $\mu$m is as follows. When the chamfered width upon completion of the lapping process becomes as large 300 $\mu$m, the chamfered width obtained through the preliminary chamfering is considered to be sufficient. If the preliminary chamfering is performed such that the chamfered width becomes greater than 300 $\mu$m, the machining time undesirably becomes long, and there is a possibility that the chamfered width exceeds the chamfered width achieved by chamfering performed after the lapping process. The reason why the chamfered width to be obtained through the preliminary chamfering process is defined by using the chamfered width-after the completion of the lapping is that it is important that a chamfered width in the above-described range is left after the completion of the lapping. If the chamfered width is defined by using the chamfered width after the preliminary chamfering itself, the chamfered width must be changed in accordance with the stock removal during the lapping.

Further, from the viewpoint of the smoothness and dimensional accuracy of the chamfered surface of the wafer, the chamfered width formed during the preliminary chamfering process performed prior to the lapping process is preferably determined such that the chamfered surface formed by the preliminary chamfering process does not remain upon completion of the chamfering process following the lapping process.

More preferably, the chamfering process is carried out after completion of the lapping process without removing the residue of the abrasive agent applied to the main surface of the wafer during the lapping process.

In the method according to the present invention in which the chamfering is conducted after completion of lapping, the wafer having smooth surfaces obtained through the lapping process is transported into a chamfering machine in which the main surface of the wafer is chuck and held by a wafer holder of the chamfering machine or is clamped by the wafer holder. Because of this, the lapped main surface of the wafer is easily scratched or damaged, and the yield of wafers decreases. In order to solve the above problem, there is utilized the abrasive agent that contains abrasive grains serving as uniform fine grains and that was used in the lapping process.

That is, it is the common practice that immediately after completion of lapping, an abrasive agent remaining on the surfaces of each wafer is removed by, for example, being washed by a cleaning process, and the wafer is transported to the next stage. Contrary to this, in the present invention, the abrasive agent is not removed from the wafer even after the lapping process is completed, and the wafer is chamfered while the abrasive agent is allowed to remain on the surfaces of the wafer. After the chamfering process is completed, the abrasive agent is removed. According to this process, as illustrated in FIG. 3A, the chamfering process is performed in the condition that the wafer 1 is covered with an abrasive agent 6, and as illustrated in FIG. 3B, a wafer holder of a chamfering machine, e.g., a sucking stage 7 for grinding operation, does not make direct contact with the main surface of the lapped wafer 1. Therefore, the main surface of the wafer 1 is protected from any damage, thus preventing a decrease in the yield of wafers.

When the chamfering process is performed without removing the abrasive agent remaining on the main surface of the wafer upon completion of the lapping process, the wafer is preferably immersed in a hydrogen peroxide aqueous solution.

The abrasive agent usually contains an alkaline surfactant. This alkaline surfactant acts to etch the wafer, and it may critically stain the wafer. The longer the time between completion of the lapping process and removal of the abrasive agent, the higher the probability of critical damage. Further, when the abrasive agent is dried because of a prolonged time between completion of the lapping process and removal operation of the abrasive agent, the alkaline surfactant coagulates with the abrasive grains, inevitably staining the wafer. Therefore, it is important to prevent the abrasive agent adhering to the wafer from drying.

However, if the chamfering process is performed immediately after the completion of the lapping process so as to protect the main surface of the wafer from any damage, the operation of removing the abrasive agent is accomplished after completion of the chamfering process, resulting in a delay in the removal of the abrasive agent. As a result, the abrasive agent becomes dried, and the alkaline surfactant tends to coagulate with the abrasive grains.

In order to prevent coagulation of the alkaline surfactant with the abrasive grains caused by the drying of the abrasive agent after the lapping process followed by the chamfering process, the wafer is preferably immersed in, for example, water. Especially, if the wafer is immersed in a hydrogen peroxide aqueous solution, there is prevented coagulation of the alkaline surfactant with the abrasive grains, which would otherwise be caused by drying of the abrasive agent. At the same time, the wafer is reliably prevented from becoming stained due to the etching action of the alkaline surfactant.

The above-described effect is derived from the surfaces of the wafer being covered with an oxide film by an action of oxygen present in the hydrogen peroxide aqueous solution. The oxide film is believed to act as a protective film, preventing the wafer from becoming stained by the etching action of the alkaline surfactant.

The concentration of the hydrogen peroxide aqueous solution is preferably in the range of 0.5–2.0 wt. %. If the concentration is less than 0.5 wt. %, the stain prevention effect achieved by the formation of an oxide film becomes insufficient. On the contrary, a concentration as high as 2.0 wt. % is sufficient, and the concentration exceeding 2.0 wt. % is not preferred from the viewpoint of production cost.

The immersing time is preferably in the range of 10 min. to 24 hours.

At least a period of 10 minutes is necessary to form an oxide film serving as a protective film. Even when the wafers are immersed in the hydrogen peroxide aqueous solution for a period longer than 24 hours, the same effect can be obtained. However, immersion over 24 hours lowers the productivity.

The temperature of the hydrogen peroxide aqueous solution (i.e., processing temperature) is preferably in the range of 1–35° C. When the temperature of the hydrogen peroxide aqueous solution is in this range, i.e., the range of normal temperature or room temperature, it is unnecessary to perform temperature control through use of a special apparatus.

Further, in the subsequent chamfering process, the amount of time the wafer passes through the chamfering machine must be shortened as much as possible in order to prevent coagulation of the alkaline surfactant with the abrasive grains caused by drying during the chamfering process.

According to the present invention, a semiconductor wafer made of, for example, silicon, GaAs, GaP, or InP can be manufactured. The present invention is especially useful in manufacture of silicon semiconductor wafers whose chamfered surfaces are desired to have higher smoothness and higher dimensional accuracy with an increase in the degree of integration of semiconductor devices.

According to the present invention, a semiconductor wafer can be manufactured without degrading the smoothness and dimensional accuracy of the chamfered surface of the wafer achieved during the chamfering process. Therefore, it becomes possible to provide a semiconductor wafer having a chamfered surface which has a higher degree of smoothness and dimensional accuracy as compared to those of wafers manufactured according to a conventional method.

BRIEF DESCRIPTION OF THE DRAWINGS

FIG. 1A and FIG. 1B are views that illustrate an adverse effect at the peripheral edge portion of a wafer caused by a lapping process;

FIG. 2 is an explanatory view that illustrates the width of a chamfering surface of a wafer;

FIG. 5 shows the shapes of chamfered surfaces measured in Example 1, wherein FIG. 5A shows the shape of a chamfered surface obtained by the inventive manufacturing method, while

DESCRIPTION OF PREFERRED EMBODIMENT

An embodiment of the present invention will now be described in detail by way of example.

Example 1

Silicon wafers were manufactured in accordance with a method according to the present invention (hereinafter referred to as the "inventive manufacturing method"). That is, silicon wafers were sliced from a monocrystalline ingot of silicon, and were subjected to a lapping process and a chamfering process in this sequence. The degree of roughness and the shape of the chamfered surface of each wafer were measured.

Separately, silicon wafers were manufactured in accordance with a conventional method (hereinafter referred to as the "conventional manufacturing method"). That is, silicon wafers were sliced from a monocrystalline ingot of silicon, and were subjected to a chamfering process, after which the roughness of the chamfered surfaces thereof were measured. Subsequently, the wafers were lapped and the roughness of each chamfered surface was measured. The shape of each chamfered surface was also measured.

Figure 3A:
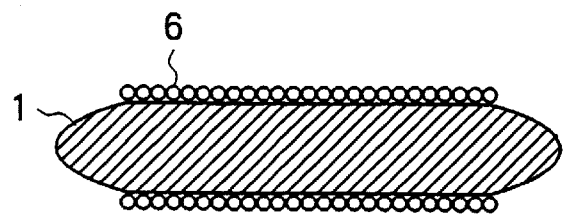
FIGS. 3A and 3B are explanatory views that illustrate protection of the main surface of a wafer provided by an abrasive agent.
Figure 3B:
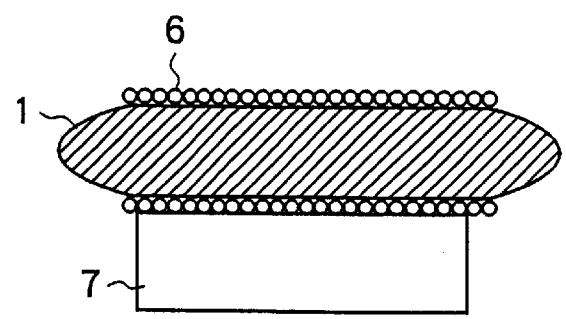
Figure 4:
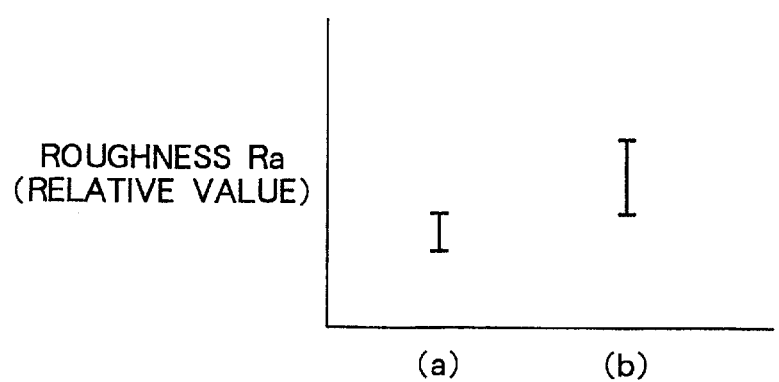
FIG. 4 is a graph showing variation ranges of roughness of chamfered surfaces measured in Example 1, wherein section (a) shows a variation range of roughness after the chamfering process of an inventive manufacturing method as well as of roughness after the chamfering process of a conventional manufacturing method, while section (b) shows a variation range of roughness after the lapping process of the conventional manufacturing method.

FIGS. 4 and 5 illustrate the results of measurement.

The section (a) in FIG. 4 shows a variation range of roughness after the chamfering process of the inventive manufacturing method as well as of roughness after the chamfering process of the conventional manufacturing method, while the section (b) in FIG. 4 shows a variation range of roughness after the lapping process of the conventional manufacturing method.

Figure 5A:
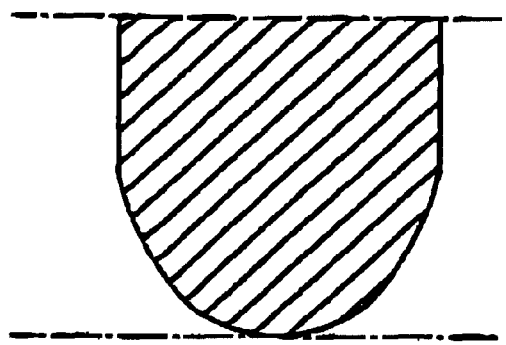
Figure 5B:
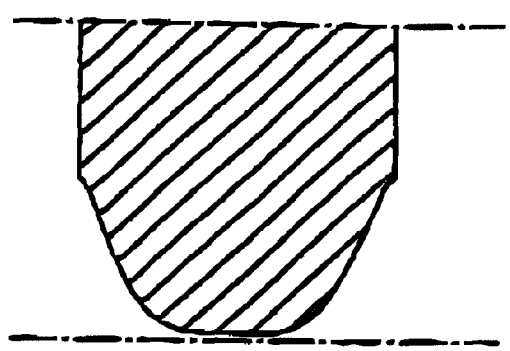
FIG. 5B shows the shape of a chamfered surface obtained by the conventional manufacturing method.

The FIG. 5A shows the shape of a chamfered surface obtained by the inventive manufacturing method, while the FIG. 5B shows the shape of a chamfered surface obtained by the conventional manufacturing method.

As is apparent from FIG. 4, if, like the case of the conventional manufacturing method, the chamfering process is first carried out (the roughness becomes in the range shown in the section (a) in FIG. 4) and then the lapping process is carried out (the roughness becomes in the range shown in the section (b) in FIG. 4), the chamfered surface becomes rougher than that it was upon completion of the chamfering process. In the inventive manufacturing method, the lapping process is performed prior to the chamfering process, so the roughness of the chamfered surface becomes equivalent to that achieved by the chamfering process in the conventional manufacturing method (the roughness becomes in the range shown in the section (a) in FIG. 4). Therefore, according to the present invention, the chamfered surface becomes smoother than that in the-conventional manufacturing method.

Further, as is apparent from FIG. 5, no wear is observed at the edge portion of each wafer manufactured in accordance with the inventive manufacturing method (see FIG. 5(A)), whereas some wear is observed at the edge portion of each wafer manufactured in accordance with the conventional manufacturing method (see FIG. 5(B)). This result demonstrates that the dimensional accuracy of the chamfered surface of each wafer manufactured in accordance with the inventive manufacturing method becomes higher than that of the chamfered surface of each wafer manufactured in accordance with the conventional manufacturing method.

Example 2

Wafers were sliced from a monocrystalline ingot of silicon. The wafers were divided into two groups. Subsequently, wafers belonging to the first group were subjected to the preliminary chamfering process such that the chamfered widths became 150 μm, while wafers belonging to the second group were subjected to the preliminary chamfering process such that the chamfered widths became 50 μm. If the width of the chamfered surface formed by the preliminary chamfering process is set to 150 μm, the chamfered width becomes 100 μm after completion of the lapping process.

Following the preliminary chamfering process, these silicon wafers of the first and second groups were lapped. Subsequently, the flatness of the main surfaces of the wafers were measured.

Figure 6:
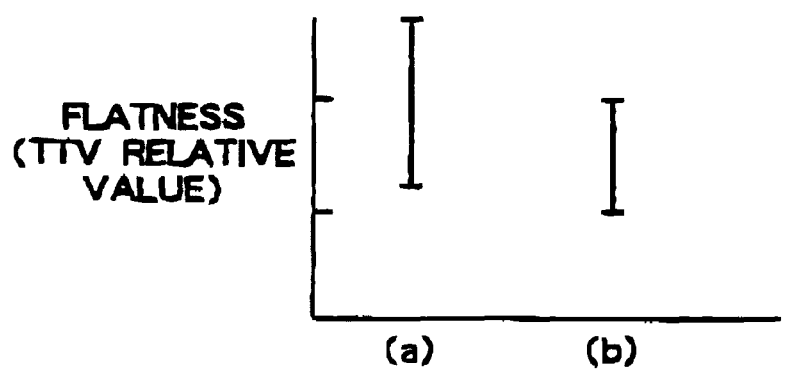
FIG. 6 is a graph showing variation ranges of flatness of the main surfaces of wafers after the lapping process measured in Example 2, wherein section (a) shows a variation range for the case where the width of the chamfered surface formed by the preliminary chamfering process was 50 μm, while section (b) shows a variation range for the case where the width of the chamfered surface formed by the preliminary chamfering process was 150 μm.

The results are shown in FIG. 6.

The section (a) of FIG. 6 shows the variation range of flatness of the main surfaces of the wafers having a preliminary chamfered width of 50 μm after completion of the lapping process, and the section (b) of FIG. 6 shows the variation range of flatness of the main surfaces of the wafers having a preliminary chamfered width of 150 μm after completion of the lapping process.

As is apparent from FIG. 6, when the chamfered width formed by the preliminary chamfering process is 50 μm, deterioration of the flatness of the main surface of the wafer upon completion of the lapping becomes critical (FIG. 6(a)). On the other hand, when the chamfered width formed by the preliminary chamfering process is 150 μm, deterioration of the flatness of the main surface of the wafer is prevented (FIG. 6(b)). Therefore, if the chamfered width formed by the preliminary chamfering process performed prior to the lapping process is determined such that the chamfered width is at least 100 μm upon completion of the lapping process, deterioration of the flatness of the main surface of the wafer upon completion of the lapping process can be prevented.

Example 3

Silicon wafers were sliced from a monocrystalline ingot of silicon, and each wafer was subjected to the preliminary chamfering process such that the chamfered width became 200 μm, and each wafer was subsequently lapped. Then, after the abrasive agent was washed away from some wafers and maintained on others, each wafer was subjected to the chamfering process. After completion of the chamfering process, wafers having scratched main surfaces were counted.

Table 1 shows the results.

TABLE 1

|  | Abrasive agent removed | Abrasive agent not removed |
| --- | --- | --- |
| Number of wafers tested | 200 | 1000 |
| Number of scratched wafers | 83 | 3 |
| Scratches generated ratio | 42% | 0.3% |

As is apparent from Table 1, if the chamfering process is performed without the abrasive agent being washed away but maintained, scratch on the main surface can be prevented.

Example 4

Silicon wafers were sliced from a monocrystalline ingot of silicon, and each wafer was subjected to the preliminary chamfering process such that the chamfered width was 200 μm, and each wafer was then lapped. Subsequently, the abrasive agent was not washed away, but maintained. Some wafers were placed in a hydrogen peroxide aqueous solution (1.0 wt. %, room temperature) and others in pure water, both for twelve hours, and the wafers were then chamfered. After completion of the chamfering process, stained wafers were counted.

The results are shown in Table 2.

TABLE 2

|  | Immersed for 12 hours in hydrogen peroxide aqueous solution | Immersed for 12 hours in pure water |
| --- | --- | --- |
| Number of wafers tested | 300 | 298 |
| Number of stained wafers | 0 | 176 |
| Stain generation ratio | 0% | 59% |

As is apparent from Table 2, when the chamfering process is performed, without removal of the abrasive agent, after twelve hours following completion of the lapping process, the wafer is prevented from becoming stained if immersed in a hydrogen peroxide aqueous solution, even though the chamfering process is performed after as long as twelve hours. On the other hand, when the wafers are placed in pure water, more than half of the wafers become stained.

The present invention is not limited to the above-described embodiment. The above-described embodiment is a mere example, and those being substantially the same as described in the appended claims and providing similar action and effects are included in the scope of the present invention.

For example, the preliminary chamfering process may be performed through use of a conventional chamfering machine or chemical rounding, such provided that the width of the chamfered surface becomes 100 μm or more after the lapping process. Also, no limitation is imposed on the shape of the chamfered surface, and the chamfered surface may have any shape.

What is claimed is:

1. A method of manufacturing a semiconductor wafer, comprising:

performing a lapping process on a wafer that has not been chamfered; and subsequently to performing the lapping process on the wafer, performing a chamfering process on the lapped wafer.

2. A method of manufacturing a semiconductor wafer, comprising the steps of:

slicing a monocrystalline ingot to obtain a wafer;

lapping the sliced wafer that has not been chamfered;

chamfering the lapped wafer;

etching the chamfered wafer with acid; and mirror-polishing the etched wafer.

3. A method of manufacturing a semiconductor wafer according to claim 1, wherein after completion of the lapping process, the chamfering process is carried out without removing an abrasive agent that is been applied to the surface of the wafer during the lapping process and remains on the surface.

4. A method of manufacturing a semiconductor wafer according to claim 2, wherein after completion of the lapping process, the chamfering process is carried out without removing an abrasive agent that is applied to the surface of the wafer during the lapping process and remains on the surface.

5. A method of manufacturing a semiconductor wafer according to claim 3, wherein the wafer is immersed in a hydrogen peroxide aqueous solution after completion of the lapping process but before the chamfering process.

6. A method of manufacturing a semiconductor wafer according to claim 4, wherein the wafer is immersed in a hydrogen peroxide aqueous solution after completion of the lapping process but before the chamfering process.

7. A method of manufacturing a semiconductor wafer according to claim 1, wherein the semiconductor wafer is a silicon semiconductor wafer.

8. A method of manufacturing a semiconductor wafer according to claim 2, wherein the semiconductor wafer is a silicon semiconductor wafer.

* * * * *